United States Patent
Gaidis

(10) Patent No.: US 6,660,568 B1
(45) Date of Patent: Dec. 9, 2003

(54) BILEVEL METALLIZATION FOR EMBEDDED BACK END OF THE LINE STRUCTURES

(75) Inventor: Michael C. Gaidis, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/290,412

(22) Filed: Nov. 7, 2002

(51) Int. Cl.$^7$ .............................................. H01L 21/82
(52) U.S. Cl. ........................ 438/128; 438/129; 438/597; 438/598; 438/599; 438/618; 438/620; 438/637; 438/638; 438/666; 438/668
(58) Field of Search ................................. 438/128, 129, 438/597, 598, 599, 618, 620, 637–638, 666, 668

(56) References Cited

U.S. PATENT DOCUMENTS

| | | |
|---|---|---|
| 5,640,343 A | 6/1997 | Gallagher et al. |
| 5,729,410 A | 3/1998 | Fontana, Jr. et al. |
| 5,861,328 A | 1/1999 | Tehrani et al. |
| 5,920,500 A | 7/1999 | Tehrani et al. |
| 5,946,227 A | 8/1999 | Naji |
| 6,048,739 A | 4/2000 | Hurst et al. |
| 6,072,718 A | 6/2000 | Abraham et al. |
| 6,104,632 A | 8/2000 | Nishimura |
| 6,165,803 A | 12/2000 | Chen et al. |
| 6,211,090 B1 | 4/2001 | Durlam et al. |
| 6,269,018 B1 | 7/2001 | Monsma et al. |
| 6,358,756 B1 | 3/2002 | Sandhu et al. |
| 6,365,419 B1 | 4/2002 | Durlam et al. |
| 6,440,753 B1 * | 8/2002 | Ning et al. ................ 438/637 |
| 2001/0035545 A1 | 11/2001 | Schuster-Woldan et al. |
| 2002/0034094 A1 | 3/2002 | Saito et al. |
| 2002/0042158 A1 | 4/2002 | Kersch et al. |
| 2002/0064069 A1 * | 5/2002 | Goebel et al. ............. 438/128 |

* cited by examiner

*Primary Examiner*—John F. Niebling
*Assistant Examiner*—Lynne A Gurley
(74) *Attorney, Agent, or Firm*—Eric W. Petraske

(57) ABSTRACT

MRAM cells are placed in the upper regions (BEOL) of an integrated circuit while simultaneously maintaining the dimensions needed for good MRAM performance and also for good operation of the logic circuit by setting the standard vertical dimension of the BEOL at the value that is suitable for logic circuits. In the areas where MRAM cells are to be placed, the (N+1)th level is etched separately. A standard etch is applied in logic areas and a deeper etch is applied in MRAM areas, so that the interlevel distance in the logic areas is the standard amount and the interlevel distance is MRAM areas is a lesser amount that is appropriate to accommodate the vertical dimensions of the material layers that go into the MRAM cells.

18 Claims, 1 Drawing Sheet

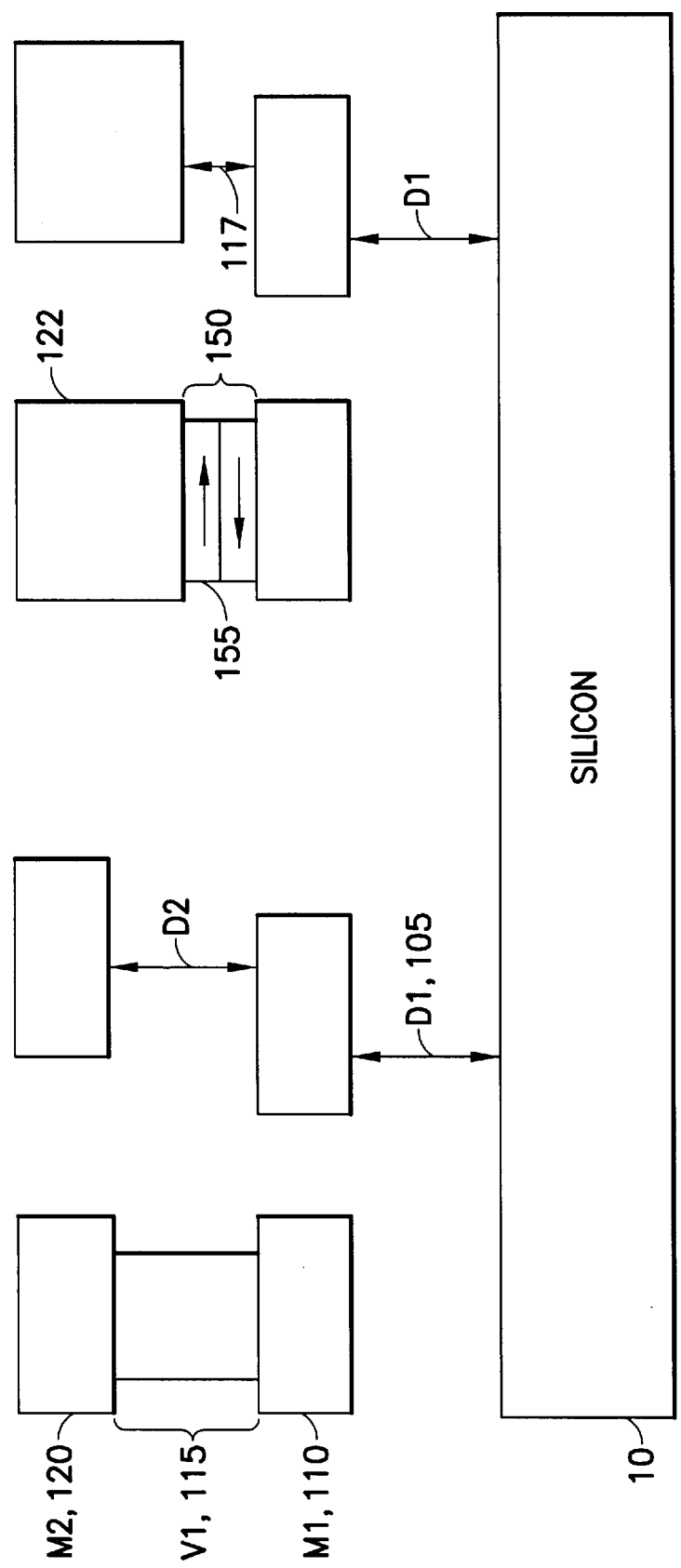

BILEVEL METALLIZATION FOR EMBEDDED BACK END OF THE LINE STRUCTURES

TECHNICAL FIELD

The field of the invention is that of embedding MRAM memories or similar structures in the back end of logic or general purpose integrated circuits.

BACKGROUND OF THE INVENTION

The field of MRAM (Magnetic memory Random Access Memory) circuits is growing rapidly, aided by the relevant considerations that MRAM is non-volatile, and promises low power consumption, high speed, and high packing density. MRAM has the considerable practical advantage that it can be implemented in the Back End of the Line (BEOL), but there remains a difficulty with the-requirements of the wiring in the BEOL. Conventional BEOL wiring schemes require that the wiring layers be spaced apart vertically to reduce capacitance and therefore permit high speed switching. MRAM devices, however, have a need for close spacing vertically between the wiring and the magnetic layers that form the MRAM cell in order to reduce the amount of current needed flip the magnetization state from one direction to the other.

The spacing needed for best performance of MRAM cells is considerably less than that needed in order to optimize capacitance and operation speed in logic circuits.

Various schemes have been proposed to move the MRAM cells away from the logic interconnect areas, but they require extra wiring layers or otherwise increase costs.

The art thus has a need for a geometrically compact configuration that places MRAM cells in close proximity to logic wiring, but still maintains the separate requirements of logic and MRAM.

SUMMARY OF THE INVENTION

The invention relates to a circuit configuration in which structures such as MRAM cells are placed in the upper regions (BEOL) of an integrated circuit while simultaneously maintaining the dimensions needed for the structure and also for good operation of the logic circuit.

A feature of the invention is the placement of an MRAM cell within an interlevel dielectric in the back end.

Another feature of the invention is the simultaneous satisfaction of the spacing requirements of the logic back end wiring and of the MRAM cell.

Another feature of the invention is etching a dual damascene aperture to a standard depth for logic wiring and etching an aperture to a deeper depth for the other structure.

BRIEF DESCRIPTION OF THE DRAWINGS

FIG. 1 illustrates a section of an integrated circuit back end according to the invention.

DETAILED DESCRIPTION

Referring now to FIG. 1, there is shown in partially pictorial, partially schematic fashion a portion of an integrated circuit according to the invention.

At the bottom of the figure, box 10 represents the substrate and lower level interconnect layers. The labels have been designated as M1 (for metal 1), etc. but the invention can be practiced at any level.

In the middle of the figure, a set of boxes 110 represent the Nth layer of interconnect. They are all in the same plane and have the same thickness, as is conventional.

On the left, above the Nth level, there is a rectangle labeled V1 and having a height indicated by bracket 115 that is the lower portion of a dual-damascene interconnect structure. Those skilled in the art are aware that a dual-damascene structure is formed by etching or otherwise opening an upper aperture (120 in this Figure) to hold the horizontal interconnect members and vertical openings such as V1 that connect the upper and lower levels. The thickness of upper members 120 will be set in order to provide the design resistance and the height of the vias will be set as a consequence of the design distance between horizontal layers (110 and 120), the vertical design distance being set by capacitance considerations, among other factors.

On the right of the Figure, horizontal connectors 122 have a top surface on the same level as connectors 120 and are thicker. The reason for the greater thickness in this case is that the MRAM cell 155 has a height 117 that is less than the height of bracket 115. The symbol representing cell 155 represents the magnetic materials themselves and also the tunnel layer between the two magnetic layers and any ancillary layers that are part of the cell.

Height 150 is set by a number of considerations in designing the cell, that are not relevant to the present invention. It is sufficient to note that engineering considerations result in: a) distance 117 is less than distance 115; and b) it is necessary that the current carried by member 122 is close vertically to the MRAM cell.

In the past, this problem would be solved by reserving a separate metal layer for the memory only. The wiring in this layer would be unsuitable for logic signal propagation, so would effectively add an entire extra level of metallization for the memory alone. Such an approach works, but it is expensive because it requires that there be two areas of each level of interconnect and requires at least two extra photolithographic masks. The yield of the integrated circuits may be considerably reduced due to the many extra processing steps required for an additional metal layer.

According to the invention, however, the problem is solved at the cost of only one additional mask and one additional step of etching. The logic interconnect levels (e.g. those on the left of the Figure) are formed as usual while the area that contains the memory cells is not patterned. The logic wiring trenches are then etched in the conventional manner. Following this, a second mask is used to pattern the area of the memory cells without exposing the logic areas. The second etching step then creates trenches in the memory areas at a depth greater than in the logic areas, sufficient to reach to the top of structures 155. This step is illustratively a single damascene (without the via V1) in order to realize the requirement for an MRAM that the current be close to the cell, but other structures could have a standard-thickness upper level and a shorter lower level to reach the top of the structure and not the top of the Nth layer. There may be need for a conventional via in the memory area, so the etching process in general can include a via formation step across the entire circuit. If the process window for etching the via does not permit etching simultaneously the different depth vias 115 and 150, one can easily alter the photolithographic masks to adapt via regions in the memory areas to use standard logic-depth wiring while at the same time using deeper wiring to contact the top of the memory elements. The memory cell structures will not have vias in this example, but other connections in that area may. The sequence of steps is:

1 Form the front end and the back end up to the Nth level of interconnect.
2 Form the memory cell 155 (optionally with dielectric around it).
3 Deposit the interlayer dielectric above the Nth level of interconnect.
4 Form the logic interconnect mask for patterning the interconnect wiring trenches where low capacitance and/or tall vias are required. This is typically a logic, or non-memory region.
5 Etch the upper portion of the dual-damascene apertures through the logic mask.
6 Form the memory interconnect mask for patterning the interconnect only in the memory regions, where deep trenches are required.
7 Etch the upper damascene apertures through the memory mask.
8 Form the (N+1)th level via mask in both the logic and memory areas.
9 Perform the via etch with enough overetch (if required) to reach down through the greater depth in the logic areas.
10 Deposit conductive filler material across the circuit with enough material to fill the deeper trenches in the memory region and planarize.

In the particular case of an MRAM structure, the fact that the upper wiring level is thicker means that the distance between the center of the current flow and the magnetic cell has changed. A modest change (increase) to the current used to write and erase the cell may be necessary.

Those skilled in the art will be aware that other structures can be formed between upper dielectric layers—e.g. capacitors, inductors, silicon-on-insulator transistors, thin film diodes, etc. One can use the techniques described in this invention to integrate devices such as these into the BEOL layers. In the case of circuits that use copper as the interconnect material, there will be liner layers deposited in the damascene trenches and/or the vias. Such layers are included in the step of forming the damascene apertures and in the steps of forming vias. The invention can be employed with conventional aluminum interconnect material and also with copper (or other ) interconnect. The invention is also not confined to oxide dielectrics and may also be used with "low-k" dielectrics.

The invention is not restricted to use with silicon wafers. Silicon-Germanium alloys, GaAs or other semiconductor wafers may be used.

The invention can be used with various process sequences to form the upper layer of interconnect. Some technologies use a single etch step to form both the damascene trenches and the vias. The invention can be used also with such technologies, with the mask for the vias being appropriately limited to avoid placing vias on the memory or other elements.

While the invention has been described in terms of a single preferred embodiment, those skilled in the art will recognize that the invention can be practiced in various versions within the spirit and scope of the following claims.

What is claimed is:

1. A method of forming an integrated circuit containing a set of MRAM memory elements placed in the BEOL comprising the steps of:

forming the front end of the integrated circuit;
   forming the first level of interconnect and subsequent levels, including the Nth level of interconnect;
   forming a set of memory elements in a memory region of said integrated circuit, said set of memory elements being in contact with a top surface of said Nth level of interconnect and having a memory cell height;
   depositing the (N+1)th layer of interlevel dielectric with a standard thickness greater than said memory cell height;
   forming logic dual damascene apertures in a logic region of the circuit, said dual damascene apertures in said logic region having a total dual damascene aperture depth sufficient to make contact to the top layer of said Nth level of interconnect and also having a logic interconnect depth, whereby the difference between said memory aperture depth and said logic interconnect depth establishes a logic via depth;
   forming memory damascene apertures in said memory region of the circuit, said memory damascene apertures in said memory region having a memory aperture depth sufficient to make contact to the top surface of said set of memory elements;
   filling both said logic dual damascene apertures and said memory apertures with conductive interconnect material; and
   completing said integrated circuit.

2. A method according to claim 1, in which said step of forming logic dual/damascene apertures in a logic region of the circuit is formed in two separate steps, with a first step of forming a set of trenches for the horizontal interconnects and a second step of forming vias; and
   said step of forming vias forms vias simultaneously in both said logic region and in said memory region.

3. A method according to claim 2, in which said step of forming vias is preceded by a step of forming damascene trenches in said memory region, whereby vias are formed through at least some of said damascene trenches in said memory region to connect to said Nth level of interconnect.

4. A method according to claim 3, in which said Nth level of interconnect is the first level, whereby said memory elements are formed between the first and second levels of interconnect.

5. A method according to claim 3, in which said conductive interconnect material is copper.

6. A method according to claim 2, in which said Nth level of interconnect is the first level, whereby said memory elements are formed between the first and second levels of interconnect.

7. A method according to claim 2, in which said conductive interconnect material is copper.

8. A method according to claim 1, in which said step of forming logic dual damascene apertures is also performed in said memory region.

9. A method according to claim 8, in which said conductive interconnect material is copper.

10. A method according to claim 1, in which said Nth level of interconnect is the first level, whereby said memory elements are formed between the first and second levels of interconnect.

11. A method according to claim 1, in which said conductive interconnect material is copper.

12. A method of forming an integrated circuit containing a set of structures placed in the BEOL comprising the steps of:

forming the front end of the integrated circuit;
   forming the first level of interconnect and subsequent levels, including the Nth level of interconnect;
   forming a set of structures in at least one separate region of said integrated circuit, said set of structures being in contact with a top surface of said Nth level of interconnect and having a structure height;
   depositing the (N+1)th layer of interlevel dielectric with a standard thickness greater than said structure height;

forming logic dual damascene apertures in a logic region of the circuit, said dual damascene apertures in said logic region having a total dual damascene aperture depth sufficient to make contact to the top layer of said Nth level of interconnect and also having a logic interconnect depth, whereby the difference between said memory aperture depth and said logic interconnect depth establishes a logic via depth;

forming structure damascene apertures in said memory region of the circuit, said structure damascene apertures in said memory region having a structure aperture depth sufficient to make contact to the top surface of said set of structures;

filling both said logic dual damascene apertures and said structure apertures with conductive interconnect material; and completing said integrated circuit.

13. A method according to claim 12, in which said step of forming logic dual/damascene apertures in a logic region of the circuit is formed in two separate steps, with a first step of forming a set of trenches for the horizontal interconnects and a second step of forming vias; and said step of forming vias forms vias simultaneously in both said logic region and in said structure region.

14. A method according to claim 13, in which said step of forming vias is preceded by a step of forming damascene trenches in said memory region, whereby vias are formed through at least some of said damascene trenches to connect to said Nth level of interconnect.

15. A method according to claim 14, in which said Nth level of interconnect is the first level, whereby said memory elements are formed between the first and second levels of interconnect.

16. A method according to claim 13, in which said Nth level of interconnect is the first level, whereby said memory elements are formed between the first and second levels of interconnect.

17. A method according to claim 12, in which said step of forming vias is preceded by a step of forming damascene trenches in said structure region.

18. A method according to claim 12, in which said Nth level of interconnect is the first level, whereby said memory elements are formed between the first and second levels of interconnect.

* * * * *